United States Patent
Cheng et al.

(10) Patent No.: US 9,741,609 B1
(45) Date of Patent: Aug. 22, 2017

(54) MIDDLE OF LINE COBALT INTERCONNECTION

(71) Applicant: INTERNATIONAL BUSINESS MACHINES CORPORATION, Armonk, NY (US)

(72) Inventors: Kangguo Cheng, Schenectady, NY (US); Lawrence A. Clevenger, Rhinebeck, NY (US); Balasubramanian S. Pranatharthi Haran, Watervliet, NY (US); John H. Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/340,226

(22) Filed: Nov. 1, 2016

(51) Int. Cl.
| | |
|---|---|
| *H01L 21/335* | (2006.01) |
| *H01L 21/768* | (2006.01) |
| *H01L 23/532* | (2006.01) |
| *H01L 23/535* | (2006.01) |

(52) U.S. Cl.
CPC .. *H01L 21/76849* (2013.01); *H01L 21/76802* (2013.01); *H01L 21/76847* (2013.01); *H01L 23/535* (2013.01); *H01L 23/53209* (2013.01)

(58) Field of Classification Search
CPC ......... H01L 21/76847; H01L 21/76849; H01L 21/76802
See application file for complete search history.

(56) References Cited

U.S. PATENT DOCUMENTS

| | | | |
|---|---|---|---|
| 6,391,785 B1 | 5/2002 | Satta et al. | |
| 6,680,514 B1 | 1/2004 | Geffken et al. | |
| 7,186,643 B2 | 3/2007 | Ahn et al. | |
| 7,629,264 B2 | 12/2009 | Bonilla et al. | |
| 9,496,362 B1* | 11/2016 | Alptekin | H01L 29/4958 |
| 2005/0003660 A1 | 1/2005 | Murakawa et al. | |
| 2012/0248608 A1* | 10/2012 | Yoo | H01L 23/53238 257/751 |
| 2014/0183738 A1 | 7/2014 | Jezewski et al. | |

(Continued)

OTHER PUBLICATIONS

Kamineni et al., "Tungsten and cobalt metallization: A material study for MOL local interconnects", IEEE IITC/AMC Conference pp. 105-107 (2016).

(Continued)

*Primary Examiner* — Bradley K Smith
(74) *Attorney, Agent, or Firm* — Cantor Colburn LLP; David Quinn (57) ABSTRACT

A method of fabricating features of a semiconductor device includes forming a contact over a substrate, the contact including a cobalt core and a liner layer arranged on sidewalls, wherein the contact includes a portion that is laterally surrounded by an interlevel dielectric (ILD); depositing another layer of ILD on the contact; etching a first opening in the ILD to expose a surface of the contact; removing the liner layer of the contact to expose a portion of the cobalt core; etching the ILD that laterally surrounds the contact to form a second opening beneath the first opening, the second opening having a width that is less than the first opening; depositing a liner on sidewalls of the first opening, the second opening, and directly on the cobalt core; and depositing a metal on the liner layer to form an interconnect structure.

14 Claims, 6 Drawing Sheets

(56) References Cited

U.S. PATENT DOCUMENTS

2015/0179579 A1    6/2015  Jezewski et al.
2015/0380302 A1*  12/2015  Mountsier ......... H01L 21/76831
                                                          438/654

OTHER PUBLICATIONS

List of IBM Patents or Patent Applications Treated as Related; (Appendix P), Filed Nov. 14, 2016; 2 pages.
Mikagi et al., "Barrier metal free copper damascene interconnection technology using atmospheric copper reflow and nitrogen doping in SiOF film", IEEE IEDM '96, pp. 365-368 (1996).
Lawrence A. Clevenger et al., "Surface Nitridation in Metal Interconnects", U.S. Appl. No. 15/272,883, filed Sep. 22, 2016.
List of IBM Patents or Patent Applications Treated as Related; (Appendix P), Filed Feb. 1, 2017; 2 pages.
Praneet Adusumilli et al., "Multi-Level Metallization Interconnect Structure", U.S. Appl. No. 15/240,700, filed Aug. 18, 2016.
Seraphin Calo et al., "System, Method and Computer Program Product for Network Function Optimization Based on Locality and Function Type", U.S. Appl. No. 15/079,368, filed Mar. 24, 2016.

* cited by examiner

MIDDLE OF LINE COBALT INTERCONNECTION

BACKGROUND

Embodiments of the present invention relate to complementary metal oxide semiconductor (CMOS) technology, and more specifically, to interconnect structures in semiconductor devices.

CMOS technology is used to construct integrated circuits such as microprocessors, microcontrollers, static random access memory (RAM) and other digital logic circuits. A basic component of CMOS designs is metal oxide semiconductor field effect transistors (MOSFETs). As MOSFETs are scaled to smaller dimensions, various designs and techniques are employed to improve device performance. Vertical transistors, in which source/drain regions are arranged on opposing ends of a vertical channel region, are attractive candidates for scaling to smaller dimensions.

SUMMARY

According to an embodiment, a method of fabricating features of a semiconductor device includes forming a contact over a substrate, the contact including a cobalt core and a liner layer arranged on sidewalls, wherein the contact includes a portion that is laterally surrounded by an interlevel dielectric (ILD); depositing another layer of ILD on the contact; etching a first opening in the ILD to expose a surface of the contact; removing the liner layer of the contact to expose a portion of the cobalt core; etching the ILD that laterally surrounds the contact to form a second opening beneath the first opening, the second opening having a width that is less than the first opening; depositing a liner on sidewalls of the first opening, the second opening, and directly on the cobalt core; and depositing a metal on the liner layer to form an interconnect structure.

According to another embodiment, a method of fabricating features of a semiconductor device includes forming a contact over a substrate, wherein the contact includes a cobalt core and a liner layer arranged on sidewalls, and wherein the contact further includes a portion that is laterally surrounded by an interlevel dielectric (ILD); depositing another layer of ILD on the contact; etching a first opening in the ILD to expose a surface of the contact; removing the liner layer of the contact to expose the cobalt core; and depositing a metal on sidewalls of the first opening, the second opening, and directly on the cobalt core to form an interconnect structure.

Yet, according to another embodiment, a semiconductor device includes a contact including a cobalt core; an interlevel dielectric (ILD) disposed on the contact; an opening extending through the ILD and around the contact, the opening having a first portion and a second portion, the first portion arranged over the second portion and having a width that is greater than the first portion, and a portion of the cobalt core extending into the first portion of the opening; and a metal disposed in the opening and around a portion of the cobalt core to form an interconnect structure over the contact.

BRIEF DESCRIPTION OF THE DRAWINGS

The subject matter which is regarded as embodiments of the invention is particularly pointed out and distinctly claimed in the claims at the conclusion of the specification. The foregoing and other features, and advantages of the embodiments of the invention are apparent from the following detailed description taken in conjunction with the accompanying drawings in which:

FIGS. 1-4 illustrate exemplary methods of making semiconductor devices according to an embodiment, in which:

FIGS. 5-6 illustrate exemplary methods of making semiconductor devices according to an embodiment, in which:

DETAILED DESCRIPTION

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, technology nodes continue to shrink beyond 7 nanometers. As such, cobalt (Co) contacts can be promising candidates for middle-of-line (MOL) interconnects. However, cobalt surfaces can easily oxidize, which can increase the contact resistance.

Accordingly, there is a need for methods for producing cobalt interconnects with reduced contacts resistance with simplified processing steps. Embodiments of the present invention provide methods and structures for forming MOL cobalt interconnect structures with reduced contact resistance. In embodiments, cobalt interconnect structures include an increased contact area around a cobalt contact core. In embodiments, cobalt oxidation layers, which can increase contact resistance, are also removed from cobalt-containing source/drain contacts and gate contacts.

Figure 1:
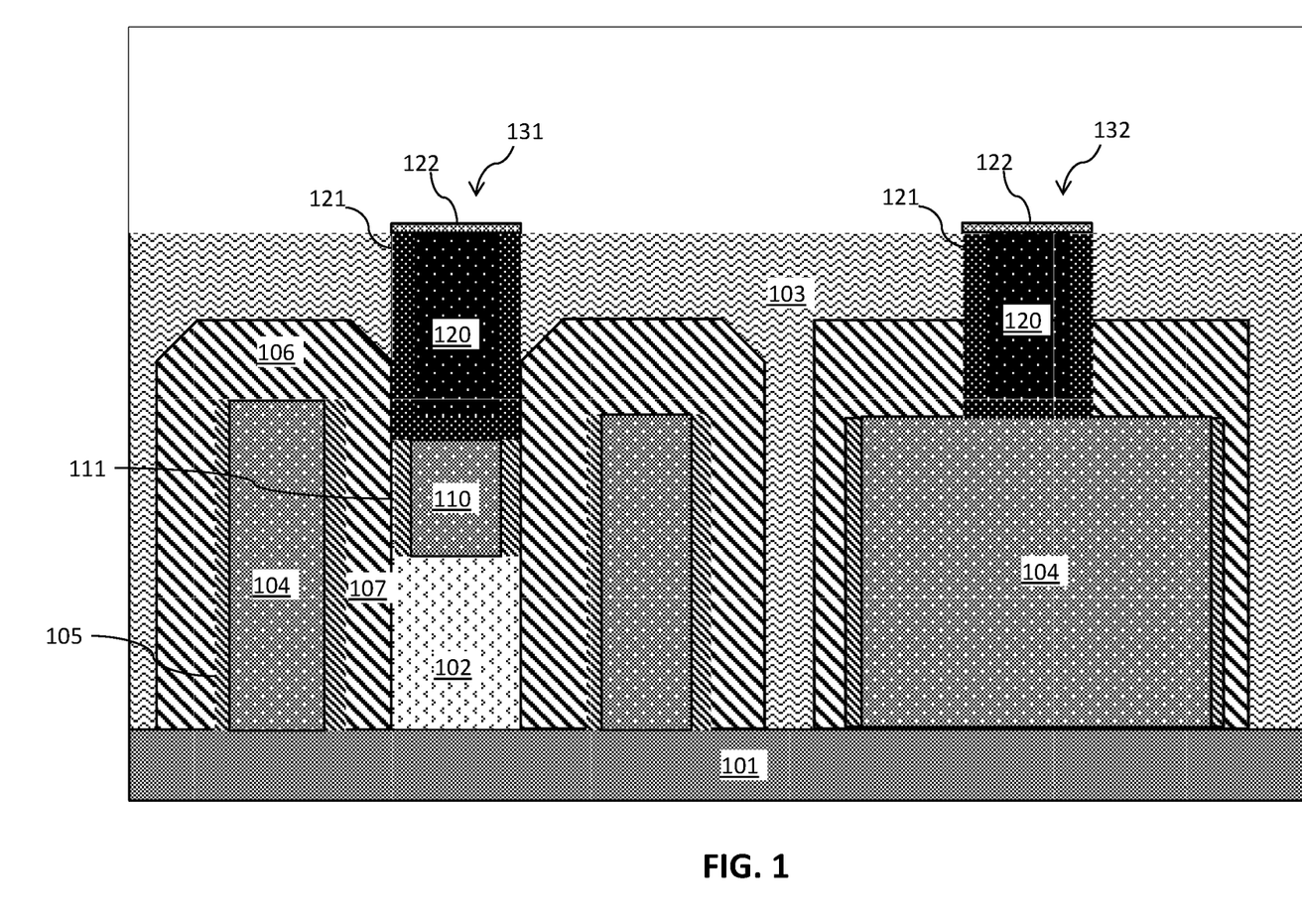
FIG. 1 is a cross-sectional side view of gates, source/drain regions, and contacts arranged on a substrate.

Turning now to the Figures, FIGS. 1-4 illustrate exemplary methods of making features of semiconductor devices according to an embodiment. FIG. 1 is a cross-sectional side view of gates, source/drain regions 102, and contacts arranged on a substrate 101.

Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other examples of suitable substrates 101 include silicon-on-insulator (SOI) substrates and silicon-germanium-on-insulator (SGOI) substrates with buried oxide (BOX) layers.

Before forming the gates, one or more fins (not shown) can be formed in the substrate 101. The fins can be formed by lithography and etching or sidewall imaging transfer. Each gate structure includes a gate stack 104, gate spacer 107, and gate cap 106.

Each gate stack 104 is a metal gate that includes one or more dielectric materials 105, one or more work function metals, and one or more metal gate conductor materials. The gate dielectric material(s) 105 can be a dielectric material having a dielectric constant greater than 3.9, 7.0, or 10.0. Non-limiting examples of suitable materials for the dielectric material 105 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material 105 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The work function metal(s) may be disposed over the gate dielectric material 105. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A conductive gate metal is deposited over the dielectric material(s) 105 and work function layer(s) to form the gate stacks 104. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. Once all of the gate stack layers are deposited, a planarization process, for example, chemical mechanical planarization (CMP), is performed to polish the surface of the conductive gate metal.

In other embodiments, each gate stack 104 includes a sacrificial gate stack that will be subsequently removed and replaced with functional gate stacks after forming the source/drain regions 102. The functional gate stacks may include the metal gate stacks described above.

The gate caps 106 are formed by depositing and etching an insulating hard mask layer, for example, silicon nitride, SiOCN, or SiBCN, on the gate stacks 104. The hard mask layer can be deposited using a deposition process, including, but not limited to, PVD, CVD, PECVD, or any combination thereof. The gate stacks 104 and hard mask layers are then patterned and etched to form high aspect-ratio gates over the substrate 101.

The gate spacers 107 include a dielectric material, for example, silicon dioxide, silicon nitride, SiOCN, or SiBCN. The dielectric material is deposited on the gate stacks 104 and then etched to form the gate spacers 107. Other non-limiting examples of materials for the gates spacers 107 include dielectric oxides (e.g., silicon oxide), dielectric nitrides (e.g., silicon nitride), dielectric oxynitrides, or any combination thereof. The gate spacer 107 material is deposited by a deposition process, for example, CVD or PVD. The etch process may be a dry etch process, for example, reactive ion etch (RIE).

Source/drain regions 102 are formed over the substrate 101 between the gate structures. The source/drain regions 102 can be formed by performing an epitaxial growth process to form epitaxial layers on the substrate 101. Epitaxial growth processes deposit a crystalline layer onto the substrate 101. Epitaxial layers may be grown from gaseous or liquid precursors. Epitaxial growth may be grown using, for example, vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron), depending on the type of transistor.

An ILD 103 is deposited on and around the source/drain regions 102 and the gate structures. The ILD 103 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The low-k dielectric oxide layer is deposited by a deposition process, including, but not limited to CVD, PVD, plasma enhanced CVD, atomic layer deposition (ALD), evaporation, chemical solution deposition, or like processes.

To form the source/drain contact 131 and the gate contact 132, contact openings are formed in the ILD 103 over the source/drain region 102 and the gate stack 104. The trench contact opening over the source/drain 102 exposes a portion of the source/drain region 102. The trench contact opening over the source/drain 102 is positioned between the gate structures. The trench contact opening over the gate stack 104 exposes a portion of the gate stack 104.

To remove the ILD 103 and form the contact trenches, a resist, such as a photoresist, may be deposited and patterned. An etch process, such as a reactive ion etch (ME), may be performed using the patterned resist as an etch mask to remove the ILD 103 until the source/drain region 102 or gate stack is exposed.

The source/drain contact 131 includes a metal silicide 110 arranged directly over the source/drain region 102. The metal silicide 110 is formed by first depositing a metallic film 111 on sidewalls of the contact trench and on the source/drain region 102 and then performing a thermal treatment to the metallic film 111. A metal silicide 110 forms directly on the source/drain region 102, and the metallic film 111 remains on sidewalls of the contact trench over the source/drain region 102.

The metallic film 111 can be deposited by performing an evaporation process or a sputtering process. The metallic film 111 is annealed by heating inside a furnace or performing a rapid thermal treatment in an atmosphere containing pure inert gases (e.g., nitrogen or argon) so that the metallic film 111 reacts with exposed semiconductor material in the source/drain region 102 to form a metal silicide layer. Non-limiting examples of suitable metal silicide 110 materials include titanium silicide, tungsten silicide, cobalt silicide, nickel silicide, molybdenum silicide, platinum silicide, or any combination thereof.

After forming the metal silicide 110 over the source/drain region 102, a liner layer 121 is deposited along sidewalls and bottom surfaces of the contact trenches. The liner layer 121 may be a bilayer liner or a single layer liner. The liner layer 121 includes any low contact resistance material, conductive liner material, or alloy. Non-limiting examples of suitable materials for the liner layer 121 include titanium, titanium nitride, tantalum, tantalum nitride, tungsten, niobium, cobalt, cobalt titanium, nickel, platinum, or any combination thereof. In some embodiments, the liner layer 121 is titanium nitride. The liner layer 121 can be formed as a single liner or a multi-layer liner of one or more materials. The liner layer 121 can be formed by any suitable deposition method. Non-limiting examples of suitable deposition methods include CVD, PVD, ALD, or any combination thereof.

After depositing the liner layer 121, cobalt 120 is deposited in the contact trenches to form the source/drain contact 131 and the gate contact 132. The source/drain contact 131 and the gate contact 132 each have a cobalt core. In some embodiments, one or more additional conductive materials may be deposited on the liner layer 121 before depositing the cobalt 120. In other embodiments, the cobalt 120 is deposited directly on the liner layer 121. Examples of other conductive materials include conductive metals, for example, aluminum (Al), platinum (Pt), gold (Au), tungsten (W), titanium (Ti), or any combination thereof. The cobalt 120 and the conductive metals may be deposited by a suitable deposition process, for example, CVD, PECVD, PVD, plating, thermal or e-beam evaporation, or sputtering. A planarization process, for example, chemical mechanical planarization (CMP) is performed to remove any conductive material from the surface of the ILD 103.

The contacts (source/drain contact 131 and gate contact 132) thus comprise a cobalt core with a liner layer arranged on sidewalls. The contacts each have a portion that is surrounded laterally by an ILD 103.

An oxidation layer 122 forms on the surface of the cobalt 120. The oxidation layer 122 includes cobalt oxide, which is due to the oxidation of cobalt in cobalt 120.

Figure 2:
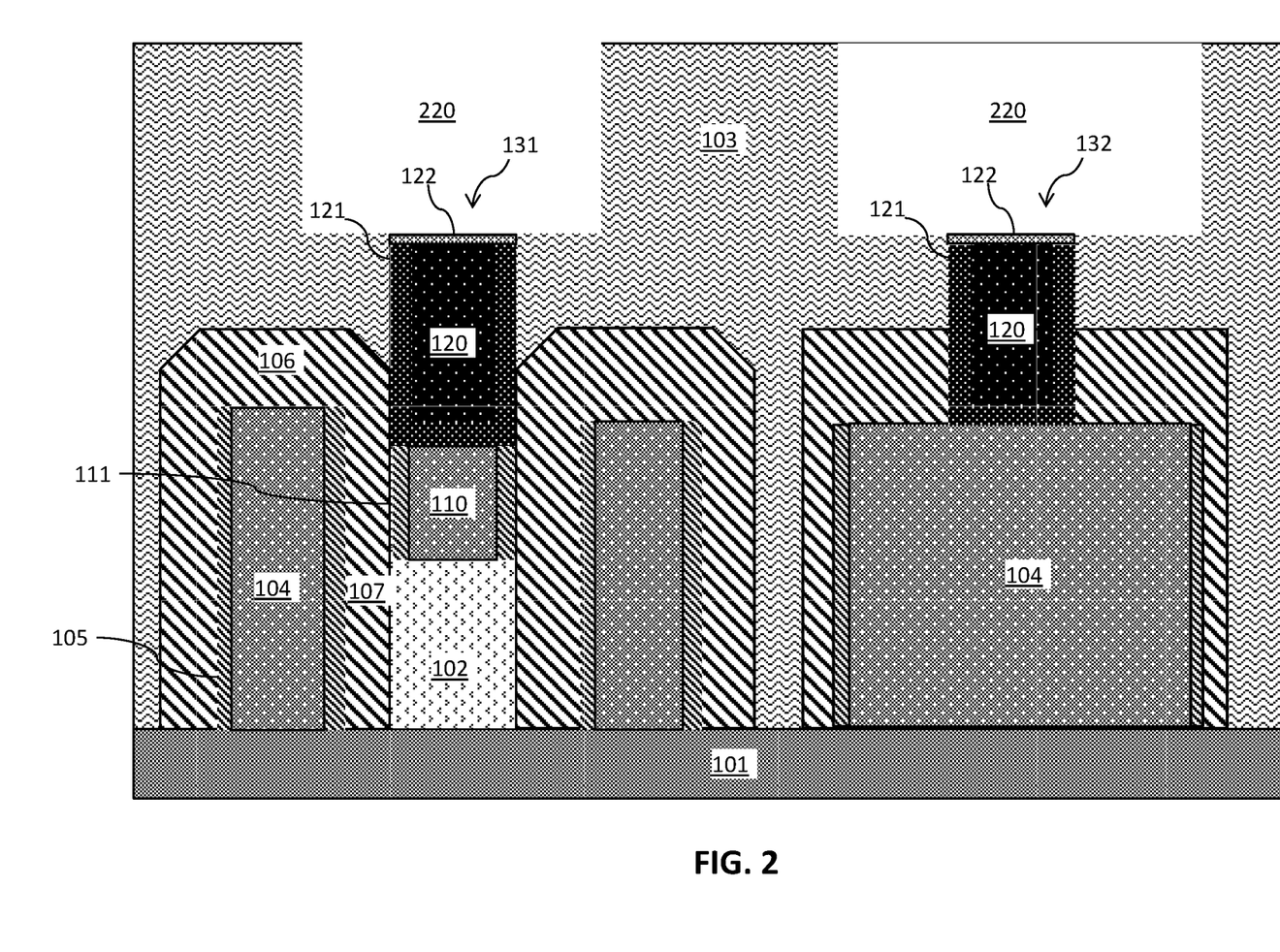
FIG. 2 is a cross-sectional side view after depositing interlevel dielectric (ILD) and forming trenches in the ILD to expose the contacts.

FIG. 2 is a cross-sectional side view after depositing another layer of ILD 103 material and forming trenches in the ILD 103 to expose a surface of the source/drain contact 131 and a surface of the gate contact 132. The ILD 103 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The low-k dielectric oxide layer is deposited by a deposition process, including, but not limited to CVD, PVD, plasma enhanced CVD, ALD, evaporation, chemical solution deposition, or like processes.

Local contact openings 220 (first openings) are formed through the ILD 103 over the source/drain contact 131 and the gate contact 132. The local contact openings 220 over the source/drain contact 131 exposes a portion of the source/drain contact 131. The local contact opening 220 over the gate contact 132 exposes a portion of the gate contact 132.

To remove the ILD 103 and form the local contact openings, a resist, such as a photoresist, can be deposited and patterned. An etch process, such as a RIE, can be performed using the patterned resist as an etch mask to remove the ILD 103 until the source/drain contact 121 and gate contact 132 are exposed.

Figure 3:
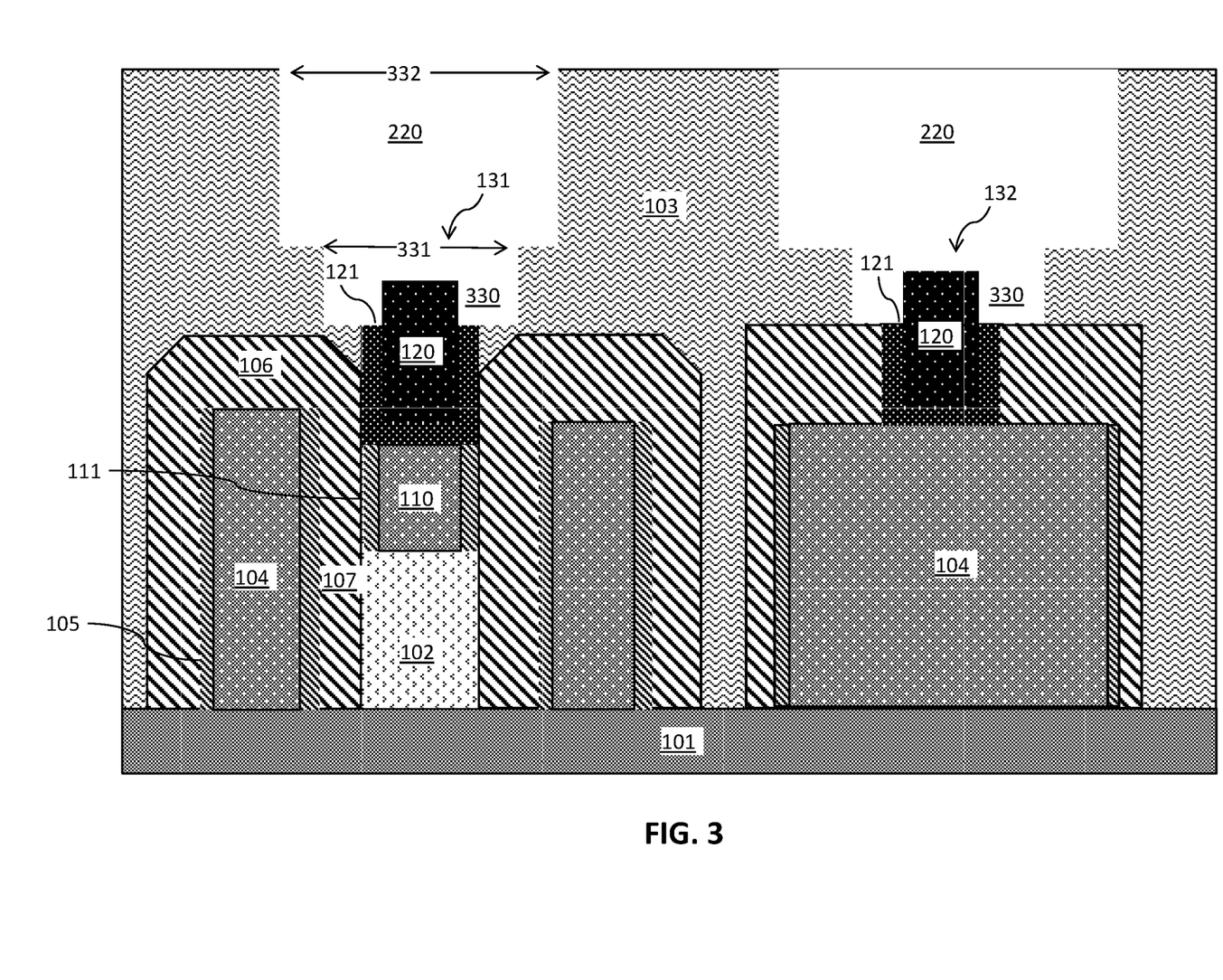
FIG. 3 is a cross-sectional side view after removing the oxidation layer over the contacts, etching the cobalt liner, and laterally widening the gap between the cobalt core and the surrounding ILD.

FIG. 3 is a cross-sectional side view after removing the oxidation layer 122 over the contacts (as shown in FIG. 2), etching the liner layer 121, and laterally widening the gap between the cobalt 120 core and the surrounding ILD 103.

An opening 330 (second opening or contact trench) around the cobalt 120 in the source/drain contact 131 and gate contact 132 is laterally expanded by etching the ILD 103 away from lateral sidewalls of the source/drain contact 131 and the gate contact 132. The distance between the cobalt 120 core and the ILD 103 in the opening 330 is in a range from about 3 to about 30 nm, or from about 6 to about 15 nm.

The width 331 of the opening 330 (second opening) is less than the width 332 of the contact opening 220 (first opening). The contact opening 330 and the contact opening 220 extend continuously from the surface of the ILD 103 to the source/drain contact 131 and the gate contact 132. The opening 220 is a first portion of the continuous opening, and opening 330 is a second portion of the continuous opening.

To form the openings 330, lithography and etching are performed. A resist, such as a photoresist, can be deposited and patterned. An etch process, such as a ME, can be performed using the patterned resist as an etch mask to remove the ILD 103 from lateral regions of the source/drain contact 131 and the gate contact 132.

A portion of the liner layer 121 is removed to expose the cobalt 120 core within the opening 330. Removing the liner layer 121 exposes sidewalls of the cobalt 120. An etch process selective to cobalt 120 is performed to remove a portion of the liner layer 121 from the source/drain contact 131 and gate contact 132. The selective etch process may be, for example, a wet etch process, such as an aqueous etchant including ammonium hydroxide, hydrogen peroxide, and water.

The oxidation layer 122 may be removed by the same etch process used to remove the liner layer 121 or by a different etch process. Removing the oxidation layer 122 exposes the top surface of the cobalt 120 core. Non-limiting examples of etch processes that may be used to remove the oxidation layer 122 include directional etch processes, e.g., reactive ion etch, sputtering, or other like processes. The etch process may be performed before or after removing the liner layer 121.

Figure 4:
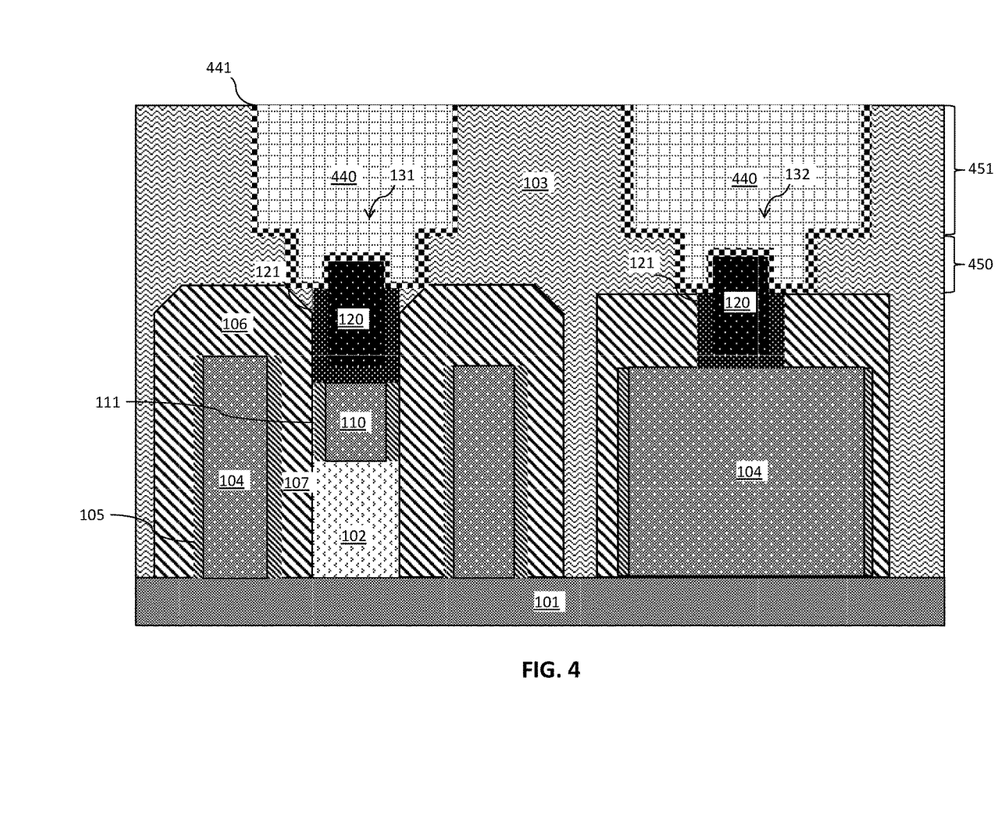
FIG. 4 is a cross-sectional side view after depositing a liner and metal to form an interconnect structure.

FIG. 4 is a cross-sectional side view after depositing a liner layer 441 and conductive metal 440 in the contact openings 220 and 330 to form an interconnect structure. The liner layer 441 is deposited along sidewalls and bottom surfaces of the contact openings 220 and 330. The liner layer 441 is also deposited directly on exposed surfaces of the cobalt 120 of the source/drain contact 131 and the gate contact 132. In the source/drain contact 131, the metal silicide 110 is arranged between the source/drain region 102 and the liner layer 121.

The liner layer 441 may be a bilayer liner or a single layer liner. The liner layer 441 includes any low contact resistance material, conductive liner material, or alloy. Non-limiting examples of suitable materials for the liner layer 441 include titanium, titanium nitride, tantalum, tantalum nitride, tungsten, niobium, cobalt, cobalt titanium, nickel, platinum, or any combination thereof. In some embodiments, the liner layer 441 is titanium nitride. The liner layer 441 can be formed as a single liner or a multi-layer liner of one or more materials. The liner layer 441 can be formed by any suitable deposition method. Non-limiting examples of suitable deposition methods include CVD, PVD, ALD, or any combination thereof.

After depositing the liner layer 441, a conductive metal 440 is deposited on the liner layer 441 to fill the remaining volumes of the contact openings 220 and 330. Non-limiting examples of conductive metals 440 include aluminum (Al), platinum (Pt), gold (Au), tungsten (W), titanium (Ti), or any combination thereof. The conductive metal 440 can be deposited by a suitable deposition process, for example, CVD, PECVD, PVD, plating, thermal or e-beam evaporation, or sputtering. A planarization process, for example, CMP is performed to remove any remaining material from the surface of the ILD 103.

Figure 5:
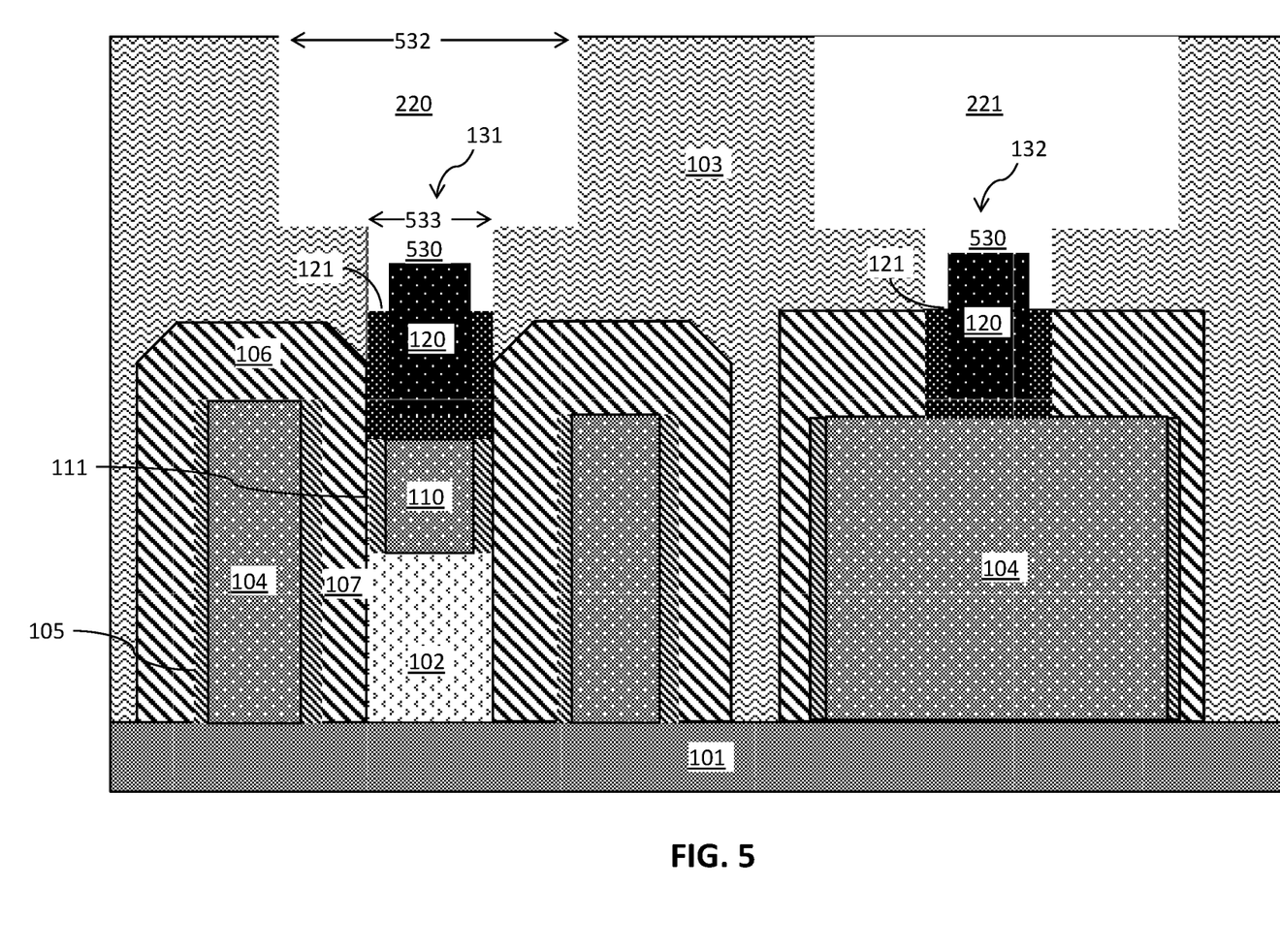
FIG. 5 is a cross-sectional side view after removing the cobalt oxidation layer and etching the cobalt liner selective to cobalt to form a zip structure.
Figure 6:
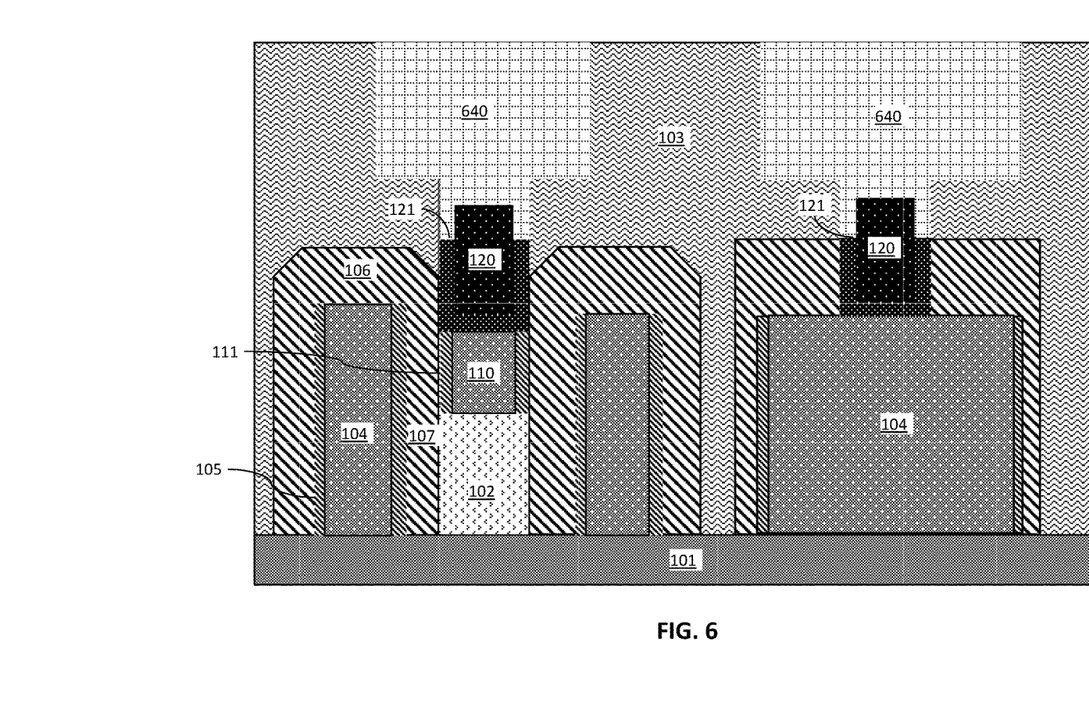
FIG. 6 is a cross-sectional side view after depositing a metal to form an interconnect structure.

FIGS. 5-6 illustrate exemplary methods of making features of semiconductor devices according to an embodiment, which continues from FIG. 2. FIG. 5 is a cross-sectional side view after removing the cobalt oxidation layer 122 (shown in FIG. 2) and etching the liner layer 121 selective to cobalt 120.

Removing the liner layer 121 selective to cobalt 120 forms a narrow gap between the laterally surrounding ILD 103 and the cobalt 120, without further etching the ILD 103. Removing the liner layer 121 forms an opening 530 around the cobalt 120 core in the source/drain contact 131 and gate contact 132. The liner layer 121 can be selectively etched by, for example, a wet etch process, such as an aqueous etchant that includes ammonium hydroxide, hydrogen peroxide, and water.

The distance between the cobalt 120 core and the ILD 103 in the opening 530 is in a range from about 2 to about 30 nm, or from about 3 to about 10 nm.

The width 533 of the opening 530 is less than the width 532 of the contact opening 220. The contact opening 530 and the contact opening 220 extend continuously from the surface of the ILD 103 to the source/drain contact 131 and the gate contact 132. The opening 220 is a first portion of the continuous opening, and opening 530 is a second portion of the continuous opening.

FIG. 6 is a cross-sectional side view after depositing a conductive metal 640 directly in the contact openings 220 and 530 to form the interconnect structure. The conductive metal 640 is deposited directly on the cobalt 120 without a liner layer. The conductive metal 640 fills the remaining volumes of the contact openings 220 and 530 to form the interconnect structure. Non-limiting examples of conductive metals 640 include aluminum (Al), platinum (Pt), gold (Au), tungsten (W), titanium (Ti), or any combination thereof. The conductive metal 640 can be deposited by a suitable deposition process, for example, CVD, PECVD, PVD, plating, thermal or e-beam evaporation, or sputtering. A planarization process, for example, chemical mechanical planarization (CMP) is performed to remove any remaining material from the surface of the ILD 103.

The above methods and devices described above form "zip" interconnect structures that have reduced contact resistance. The increased contact area around the cobalt contact cores decrease contact resistance. Cobalt oxidation layers, which can increase contact resistance, are also removed from cobalt-containing source/drain contacts and gate contacts.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating features of a semiconductor device, the method comprising:
    forming a contact over a substrate, the contact comprising a cobalt core and a liner layer arranged on sidewalls, wherein the contact includes a portion that is laterally surrounded by an interlevel dielectric (ILD);
    depositing an another layer of ILD on the contact;
    etching a first opening in the another layer of ILD to expose a surface of the contact;
    removing the liner layer of the contact to expose a portion of the cobalt core;
    etching the ILD that laterally surrounds the contact to form a second opening beneath the first opening, the second opening having a width that is less than the first opening;
    depositing a liner on sidewalls of the first opening, the second opening, and directly on the cobalt core; and
    depositing a metal on the liner layer to form an interconnect structure.

2. The method of claim 1, wherein the contact comprises an oxidation layer on a surface of the cobalt core.

3. The method of claim 2 further comprising removing the oxidation layer after etching the first opening.

4. The method of claim 1, wherein the contact comprises a source/drain contact.

5. The method of claim 1, wherein an oxidation layer on the cobalt core is exposed after etching the first opening in the ILD.

6. The method of claim 1, wherein the contact comprises a source/drain contact, and the source/drain contact further comprises a silicide that is arranged between a source/drain region and the liner.

7. The method of claim 6, wherein the silicide comprises titanium silicide.

8. The method of claim 1, wherein the contact comprises a gate contact.

9. A semiconductor device, comprising:
    a contact comprising a cobalt core;
    an interlevel dielectric (ILD) disposed on the contact;
    an opening extending through the ILD and around the contact, the opening having a first portion and a second portion, the first portion arranged over the second portion and having a width that is greater than the first portion, and a portion of the cobalt core extending into the first portion of the opening; and
    a metal disposed in the opening and around a portion of the cobalt core to form an interconnect structure over the contact.

10. The semiconductor device of claim 9, wherein the contact comprises a source/drain contact arranged on a source/drain region.

11. The semiconductor device of claim 9, wherein the contact comprises a gate contact arranged on a gate.

12. The semiconductor device of claim 9, wherein the metal is disposed directly on the cobalt core.

13. The semiconductor device of claim 9 further comprising a liner arranged between the metal and the cobalt core of the contact.

14. The semiconductor device of claim 13, wherein the contact further comprises a liner arranged on sidewalls of the cobalt core.

* * * * *

UNITED STATES PATENT AND TRADEMARK OFFICE
CERTIFICATE OF CORRECTION

PATENT NO.       : 9,741,609 B1
APPLICATION NO.  : 15/340226
DATED            : August 22, 2017
INVENTOR(S)      : Kangguo Cheng et al.

It is certified that error appears in the above-identified patent and that said Letters Patent is hereby corrected as shown below:

In the Specification

Column (1) Lines (55-56) should read:
Yet, according to another embodiment, a semiconductor device includes a contact including a cobalt core; an interlevel dielectric (ILD) disposed on the contact; an opening extending through the ILD and around the contact, the opening having a first portion and a second portion, the first portion arranged over the second portion and having a width that is greater than the second portion, and a portion of the cobalt core extending into the first portion of the opening; and a metal disposed in the opening and around a portion of the cobalt core to form an interconnect structure over the contact.

In the Claims

Column (10) Line (20) should read:
A semiconductor device, comprising:
a contact comprising a cobalt core;
an interlevel dielectric (ILD) disposed on the contact;
an opening extending through the ILD and around the
    contact, the opening having a first portion and a second
    portion, the first portion arranged over the second
    portion and having a width that is greater than the second
    portion, and a portion of the cobalt core extending into
    the first portion of the opening; and
a metal disposed in the opening and around a portion of
    the cobalt core to form an interconnect structure over
    the contact.

Signed and Sealed this
Seventh Day of November, 2023

Katherine Kelly Vidal
*Director of the United States Patent and Trademark Office*